United States Patent [19]

Fischerauer

[11] Patent Number: 5,867,075
[45] Date of Patent: Feb. 2, 1999

[54] SURFACE WAVE DUAL CONVERTER FOR A DUAL FILTER IN PARTICULAR FOR TELEVISION SETS

[75] Inventor: Alice Fischerauer, Pliening, Germany

[73] Assignee: Siemens Aktiengesellschaft, Munich, Germany

[21] Appl. No.: 627,773

[22] Filed: Apr. 1, 1996

[30] Foreign Application Priority Data

Mar. 31, 1995 [DE] Germany ............ 195 12 251.8

[51] Int. Cl.⁶ .................................................. H03H 9/64
[52] U.S. Cl. ................... 333/193; 333/196; 310/313 B; 310/313 C
[58] Field of Search .................... 333/193, 196; 310/313 B, 313 C

[56] References Cited

U.S. PATENT DOCUMENTS

| 4,296,391 | 10/1981 | Hazama et al. | 333/196 X |
| 4,604,595 | 8/1986 | Kadota | 333/196 |
| 4,673,901 | 6/1987 | Ehrmann-Falkenaer et al. | 333/196 |
| 4,918,349 | 4/1990 | Shiba et al. | 333/154 X |
| 4,954,795 | 9/1990 | Choi | 333/196 X |
| 5,309,057 | 5/1994 | Yamamoto | 310/313 C |

FOREIGN PATENT DOCUMENTS

| 0 111 978 A2 | 6/1984 | European Pat. Off. . |
| 0188263 | 7/1986 | European Pat. Off. . |
| 3321843 | 12/1983 | Germany . |
| 2945643 | 8/1988 | Germany . |
| 4196709 | 7/1992 | Japan | 333/193 |
| 2 123 637 | 2/1984 | United Kingdom . |
| 2044569 | 10/1989 | United Kingdom . |

*Primary Examiner*—Benny Lee
*Attorney, Agent, or Firm*—Herbert L. Lerner; Laurence A. Greenberg

[57] ABSTRACT

A dual-function converter, particularly for a dual filter, suitable as a channel filter for double-standard input signals in television sets. Only a single input converter is disposed on the substrate chip, and it has two inputs. The filter configuration of the converter includes interdigital adaptation regions, which are connected in terms of potential to suit whichever of the input signals is selected.

5 Claims, 2 Drawing Sheets

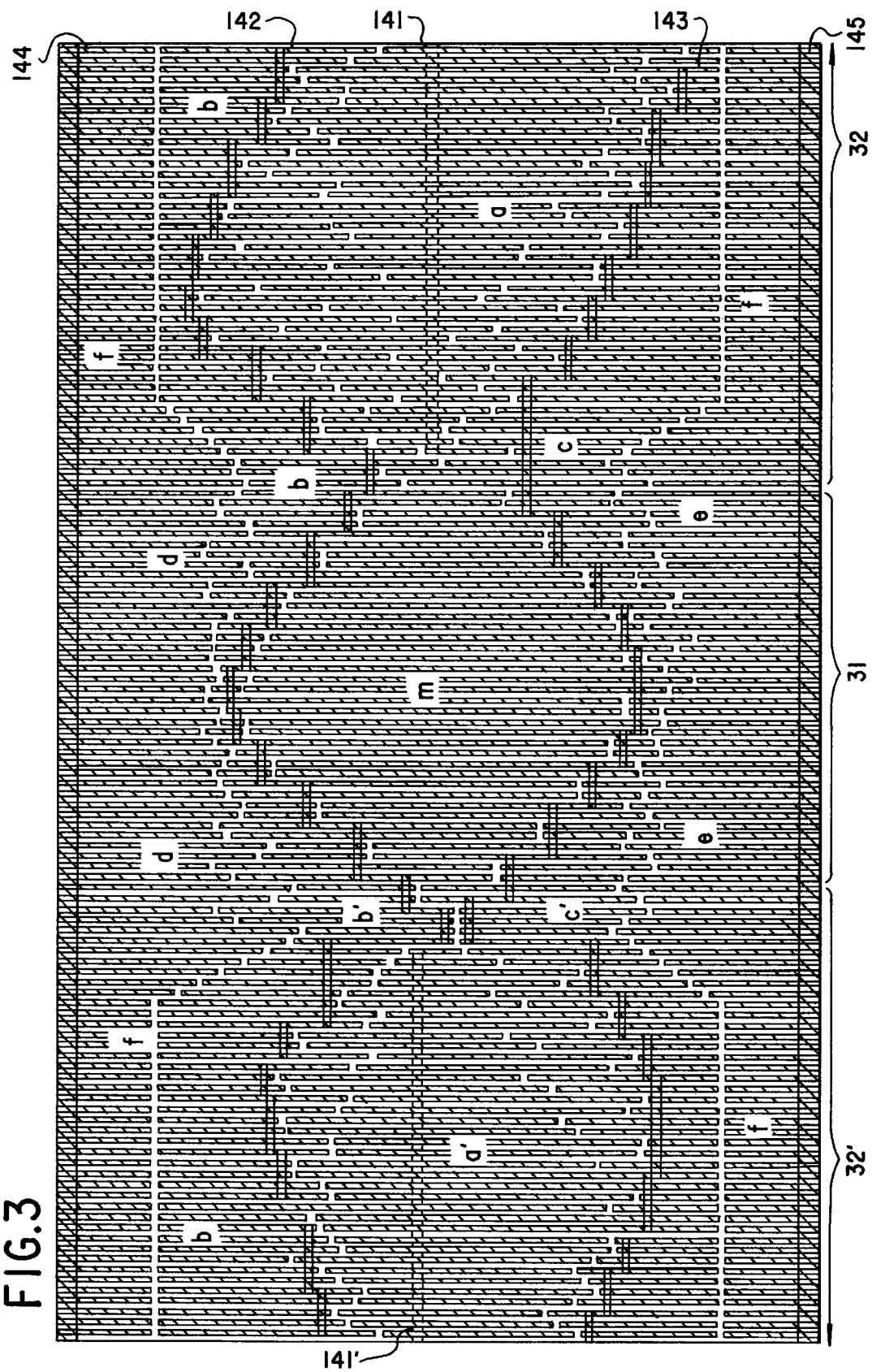

SURFACE WAVE DUAL CONVERTER FOR A DUAL FILTER IN PARTICULAR FOR TELEVISION SETS

BACKGROUND OF THE INVENTION

1. Field of the Invention

The invention relates to a dual converter, suitable for a dual filter, of the kind that can be used in particular in television receiver sets as a single channel filter, instead of the two channel filters previously used.

2. Description of the Related Art

In TV sets, the prior art has conventionally used TV channel filters which, together with the high-frequency signal of a tunable oscillator, allow the TV viewer to make a selection of a desired channel. It has been known for decades to use TV filters constructed in accordance with surface acoustic wave technology.

The TV signals to be received on the channels assigned to the various TV stations have certain standardized characteristics. However, the standards are not uniform. For instance, even within Europe there are different standards, for example because of the various channel bandwidths in the different countries, such as in Germany and in France. A standard-specified different on-state performance of the channel filters for different standards is also provided.

For double-standard receivers in the prior art, for instance, two different surface acoustic wave filters are used as the channel filters, one for one standard and the other for the other standard. It is known for two such different channel filters to be disposed side by side on a substrate chip. However, nearly as much substrate material is needed for this as for two individual, separate filters together. Combining two channel filters for different standards on one substrate body of approximately twice the size (as compared to the single filter) serves essentially to simplify the mounting of the filter and the like.

SUMMARY OF THE INVENTION

It is accordingly an object of the invention to provide a surface acoustic wave double converter for a dual filter, in particular for television receivers, which overcomes the above-mentioned disadvantages of the heretofore-known devices and methods of this general type and which, after decades of use of the above-described prior art, improves the older technology, in particular by using less substrate material. It is important thereby to not sacrifice any of the other advantages of the proven prior art technology.

With the foregoing and other objects in view there is provided, in accordance with the invention, a surface wave converter, comprising:

a piezoelectric substrate, and an interdigital structure located on the substrate, the interdigital structure defining a first part and at least one second part, the parts having converter electrode fingers defining regional interdigital overlaps among one another;

the first part having a partial structure with two first regions and interdigital overlaps between the two first regions;

the at least one second part having electrode overlaps of the first regions and having converter electrode fingers defining a respective further region, the further region being disposed between and laterally adjacent to the two first regions; and at least one additional region including converter electrode fingers disposed laterally adjacent a respective one of the two first regions and having interdigital electrode overlaps with the converter electrode fingers of the respective first region.

In accordance with an added feature of the invention, the surface wave converter includes two further converter electrode regions inserted respectively between two of the first regions, and two additional converter electrode finger regions each positioned laterally adjacent to a respective one of the first regions.

In accordance with an additional feature of the invention, the interdigital structure defines a meandering structure, the meandering structure including a first meandering curve and two further meandering curves, one of the further meandering curves extending on one side of the first meandering curve and the other of the further meandering curves extending on the other side of the first meandering curve, and wherein the first meandering curve includes two branches.

With the above and other objects in view, there is also provided, in accordance with the invention, a surface wave converter, comprising: an interdigital structure disposed on piezoelectrical material; the interdigital structure having finger electrodes defining electrode finger overlaps with a meandering structure, the meandering structure including a first meandering curve of the converter, and at least one further meandering curve of interdigital overlaps; the at least one further meandering curve extending substantially parallel to the first meandering curve; and the first meandering curve having at least one branching point at which the first meandering curve continues in two branches of meandering curves.

In accordance with again an added feature of the invention, said at least one further meandering curve are a first and a second further meandering curves, the first further meandering curve extending from one side of the first meandering curve, and the second further meandering curve extending from the other side of the first meandering curve, and the first meandering curve laterally branching into two branchings.

In accordance with again another feature of the invention, there is also provided a surface wave filter for two input signals each of a given standard, comprising:

a piezoelectric substrate carrying a dual-function input converter receiving the two input signals chronologically switched in alternation and generating one output signal each of the respectively same standard;

the dual-function input converter comprising an interdigital structure disposed on the substrate, said interdigital structure defining a first part and at least one second part, the parts having converter electrode fingers defining regional interdigital overlaps among one another;

the first part having a partial structure with two first regions and interdigital overlaps between the two first regions;

the at least one second part having electrode finger overlaps of the first regions and having converter electrode fingers defining a respective further region, the further region being disposed between and laterally adjacent to the two first regions; and at least one additional region including converter electrode fingers disposed laterally adjacent a respective one of the two first regions and having interdigital electrode finger overlaps with the converter electrode fingers of the respective first region.

In accordance with again a further feature of the invention, the surface wave filter includes two further converter electrode finger regions inserted respectively between two of the first regions, and two additional converter electrode finger regions each positioned laterally adjacent to a respective one of the first regions.

In accordance with yet a further feature of the invention, the interdigital structure defines a meandering structure, the meandering structure including a first meandering curve and two further meandering curves, one of the further meandering curves extending on one side of the first meandering curve and the other of the further meandering curves extending on the other side of the first meandering curve, and wherein the first meandering curve includes two branches.

In accordance with yet another feature of the invention, the input signals are television input signals and the surface wave converter is a television channel signal converter for input signals of two different standards.

In accordance with a concomitant feature of the invention, the surface wave converter includes an input receiving a single electrical input signal, said piezoelectric substrate and the interdigital structure being a surface wave generator outputting two electrical signals from the single electrical input signal, the two electrical signals being switchable back and forth in chronological alternation.

A dual filter with a dual converter according to the invention has the property that, because of its structure according to the invention and its filter configuration (in the form of a channel filter), it is capable of meeting the demands for two different TV standards even though it is itself united in a single filter.

Other features which are considered as characteristic for the invention are set forth in the appended claims.

Although the invention is illustrated and described herein as embodied in a surface acoustic wave double converter for a dual filter, in particular for television receivers, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

BRIEF DESCRIPTION OF THE DRAWING

FIG. 3 is a plan view of an exemplary embodiment of a converter according to the invention.

DESCRIPTION OF THE PREFERRED EMBODIMENTS

Figure 2:
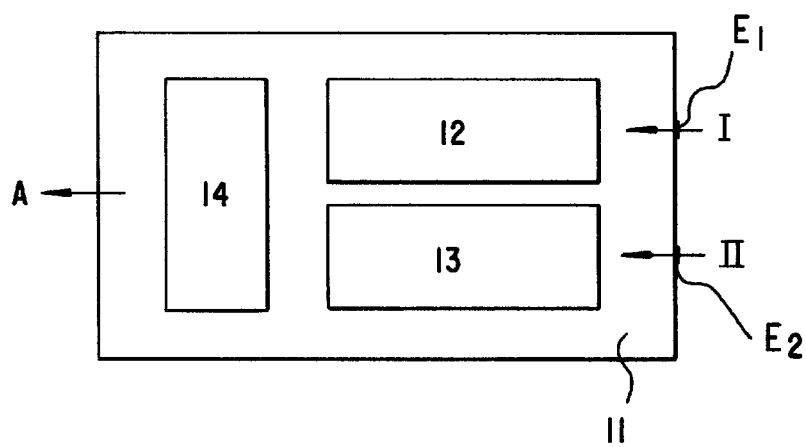
FIG. 2 is a similar view of a filter according to the prior art.

Referring now to the figures of the drawing in detail and first, particularly, to FIG. 2 thereof, there is seen a prior art filter which includes two interdigital converters 12 and 13 on piezoelectric material, in particular on a substrate chip 11. The two converters are placed side by side on the substrate, as shown. They act as input converters with the inputs E1 and E2 for TV input signals of two different TV standards. Via an electronic switch inside the apparatus, the switch being disposed between the antenna input terminal for the signal and the inputs E1 and E2, the entire input signal of the antenna can be applied either to the one input E1 or the other input E2, being switched back and forth chronologically. The one converter 12 is configured for the input signal of the one standard, and the other converter 13 is configurated for the input signal of the other standard. The one converter 12 generates an acoustic wave, in accordance with its converter structure. This wave is converted back, in the output converter 14 that is common to both input filters 12, 13, into an electrical signal that has the shape required by the TV set, so that the TV picture of the selected channel can be seen, correctly reproduced, on the screen. The output converter 14 has an output A for outputting signals. This applies logically for the input signal at the input E2 of the second converter 13 as well.

The foregoing system is in the prior art and, accordingly, the description and illustration thereof are limited herein to the diagram of FIG. 2.

Figure 1:
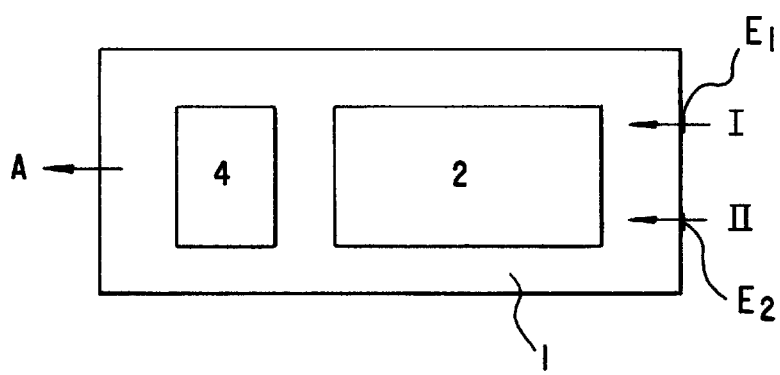
FIG. 1 is a schematic plan view of a filter according to the invention.

On approximately the same scale as FIG. 2, FIG. 1 shows a basic diagram of a dual filter with a converter according to the invention. The inputs E1 and E2 are again selectively switchable, in the "dual function" form of an input converter 2 and the output converter 4. Components of the filter of the invention are mounted on a piezo-electric substrate chip 1. The substrate chip 1, as a comparison of FIGS. 1 and 2 shows, may be considerably smaller than the substrate chip 11 of the prior art filter combination of FIG. 2.

It should be pointed out that the size/quantity of monocrystalline substrate material used is a substantial cost factor for such a filter as that involved in the invention. Another substantial cost factor is the hermetically sealed housing of the filter. For a smaller substrate, which is made possible by the invention, a less-expensive smaller housing suffices, without—and this is also significant—requiring higher insertion damping.

The layout, which makes it possible to realize the invention, of the converter structure of the "dual function" (input) converter 2 will be described in further detail in conjunction with FIGS. 3 and 4.

FIG. 3 shows as an example a substantial portion of the design of an input converter 2 according to the invention for a filter, which can advantageously be used, for instance so that TV sets can receive TV channels of different standards. The embodiment was originally configured for the German and the French standards. It is equally possible, of course, to utilize the basic teaching herein for other standards as well.

The layout according to the invention of the structure of the input converter 2 of a filter can be described functionally as being split into three parts. These extend next to one another in the primary direction of propagation of the surface acoustic wave. The electrode fingers of the structure are oriented at right angles to this axial propagation direction. The middle part 31 of the converter 2 includes a part m, which is important to the integral damping performance of the filter of the invention and has relatively thick electrode finger overlaps in which part the predominant amount of conversion of the electrical signal into the surface acoustic wave also takes place. This middle part 31 thus relatively extensively matches that which is present in the prior art converter 12, 13 as well.

In filter terms, the two parts 32 and 32' adjoining the part 31 serve above all to shape the on-state curve, which is quite well known per se. The filter layout of such an input converter is also accomplished in the invention with the aid of available optimizing algorithms. In the invention, however, different peripheral conditions are associated with them. This then leads to the novel filter design, which is distinguished in an inventive way from the prior art.

Figure 4:
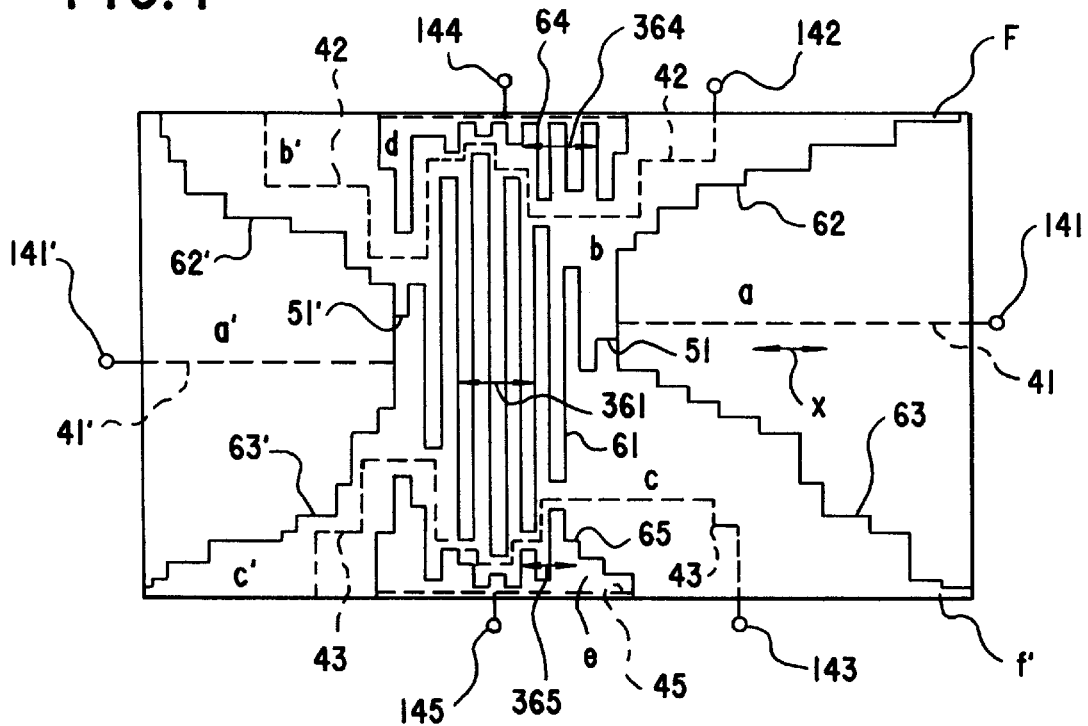
FIG. 4 is a schematic diagram of the meandering structure of the overlapping distributions in the example of FIG. 3.

FIG. 4 shows the meandering structures of the electrode finger overlaps of FIG. 3, of the kind that result or are present in the middle part 31 and the two peripheral parts 32 and 32' of the design of a "dual function input converter" provided according to the invention.

As is also readily apparent to one skilled in the art from the meandering structure, the region m is the region of the pronounced overlaps in the digitally disposed converter electrode finger. Letters a and a' designate regions of converter electrode finger that are located in the parts 32 and 32' of FIG. 3. The converter electrode finger in region a each have relatively short lengths of electrode finger overlap with the further electrode finger of the converter 2 that are provided here in regions b and c. The same is correspondingly true for the overlap of the converter electrode finger of region a' with the converter electrode finger of regions b' and c'.

A special feature of the invention is also the converter electrode finger of regions d and e, in what is intrinsically the middle part 31 of the dual-function input converter 2 of the invention. However, it is also possible for only a single such region (d or e) to be provided in the invention. Nevertheless, to produce the layout of the converter according to the invention, it can be advantageous to provide two such regions d and e, as in this example.

Shown in FIG. 4, in dashed lines, are bus bars which serve to supply the appropriate potential of the converter electrode finger to the various regions. By suitable connection of potential to the bus bar 41, all the converter electrode finger of region a can be acted upon by that potential. The same is true for the bus bar 41' of region a'. The numerals 42 and 43 indicate the various bus bars of the regions b, b' and c, c', respectively. The bus bars 44 and 45 belong to regions d and e, respectively.

To avoid misunderstandings, it should be noted that along the upper edge in FIG. 3 on the one hand and the lower edge on the other of the structure shown in FIG. 3, still other electrode finger regions f and f' adjoin them. As can be seen from FIG. 3, however, these regions f and f' are free of any electrode finger overlaps whatsoever, and they serve to equalize the propagation of the surface acoustic wave in the surface of the substrate chip. This changes nothing in the fact that the electrode fingers of region d continue in the form of electrode fingers in the region f. The same applies accordingly to the regions e and f'.

In order to define the converter of the invention, which here is used as an input converter 2 of a filter, in distinction from the prior art, it is especially appropriate to describe the particular features of the plurality of meandering polygonal lines (hereinafter called meandering curves), present in a converter according to the invention, in the meandering structure already mentioned once above. The parts 32, 31 and 32' show the electrode fingers in an expansion direction of the surface acoustic wave arranged in series. The regions a–e and a'–e' define electrode finger groupings which are separated from each other by the meandering curves. The middle region m describes an overlapping area of the two regions bb' and cc' in which the electrode fingers overlap each other.

One particular feature of the invention is that a converter according to the invention, in its (substantially) middle region 31 already mentioned above, have at least one further meandering curve 64 and/or 65, in addition to the meandering curve 61 of the middle region m. In the known converters of this sort in the prior art, there is only a single meandering curve of the interdigital overlaps. The example of FIGS. 3 and 4 includes three such meandering curves 61, 64 and 65 in the middle region 31, which as can be seen especially from FIG. 4 extend with their main directions 361, 364 and 365 substantially in the direction of the main propagation direction x of the wave, and are positioned laterally, side by side, with respect to this propagation direction x. Another particular feature of the meandering structure of the converter 2 of the invention is the presence of at least one branching point 51, 51' in the course (for instance at one or both ends of the meandering curve 61. As visible particularly in FIG. 4, the meandering curve 61 in the region 32 continues from the branching point 51, in the form of two further meandering curves 62 and 63. In the example of FIG. 4 (and FIG. 3), the meandering curve 61 continues from the branching point 51' in the form of the meandering curves 62' and 63'. As already mentioned, the input converter 2 according to the invention for a filter has a meandering structure with at least one such branching point 51 or 51'. The meandering curve 62 defines the overlaps of the electrode fingers of region a with those of region b, and the meandering curve 63 defines those of region a with those of region c. Logically, the meandering surface 62', 63' define the overlaps of the electrode finger of region a' with those of the region b' and c', respectively.

The special nature of the regions b and c present in the invention is the result of the branching at the point 51. The same is correspondingly true for branching at the point 51' for the regions b' and c'.

In the input converter 12, 13 of FIG. 2 of the prior art, a meandering structure corresponding to FIG. 4 has a substantially different appearance. In particular, it lacks any further lateral, side-by-side meandering curve, nor are there any points at which branching of the meandering curves of the electrode finger overlaps occurs.

With regard to the regions b, b' on the one hand and c, c' on the other, it should be pointed out that they have substantial significance for the electrode finger structure of the converter 2.

As a peripheral condition for the use of the optimizing algorithm, the criteria that pertain to the standardized functions of both the input signal of one standard and the input signal of the other standard are used. Further adaptation of the middle region m to the one standard, that is, as a filter function of the channel filter prescribed for the one standard, is accomplished with the overlaps with the prongs of region d. Logically, the region e has a corresponding significance for the other transmission function, for instance as a channel filter for the other standard. Regions d and e perform an important function as adaptation elements for the filter according to the invention.

A converter 2 according to the invention with the dual function of the invention is operated in practice as follows, as an example and advantageously. As filters of the one transmission function, for instance as TV channel filters for the one standard, the converter electrode fingers of regions a, a', d and e are applied to a predetermined potential, such as ground potential. For this transmission function, the regions c, c' are additionally connected to the aforementioned regions, and the converter electrode fingers of region b, b' remain as a counterpart pole for connection of the one input signal I. For the second transmission function, the regions a, a', d and e remain connected to one another, that is, are again connected to ground potential, and the converter programs of region b, b' are now connected to the converter electrode fingers of these regions. Acting as the counterpart pole now are the converter electrode finger of region c, c', to which the other input signal II is delivered. One half of the converter electrode fingers of region m is connected with the region b, b', and the other half is connected to the region c, c'.

Aside from the interdigital converter action in the middle region m of the input converter 2 of the filter, a further focus of interdigital action for the one transmission function is accordingly present at the overlaps of the converter electrode fingers of region b, b' with all its neighboring regions. For the other transmission function, this additional focus is located at the overlaps of the converter electrode fingers of region c, c' with the converter electrode fingers of its neighboring regions. This concept of the invention is taken appropriate into account in preparing the design of the filter or converter when the optimizing algorithm is employed. The regions b, b' on the one hand and c, c' on the other, and in particular the portion of the region located between the pronounced overlaps of region m and the region d on the one hand and the region e on the other are an available region of variation.

Regions d and e can also be understood to be regions having overlaps of the kind that adapt the common dual-function converters of the dual filter to the one transmission function on the one hand and the other transmission function on the other. By the above-described choice of polarization of the terminals of regions bb' and cc', the particular region d or e of these corrective overlaps for the applicable transmission function I, II according to the input signals I, II; is acted upon, together with the respective half of the converter prongs of region m, by one or the other input signal.

A dual filter embodied by the invention is produced by the usual methods of development and production of surface acoustic wave filters. Preferably, the electrical potential terminals 141', 141, 142, 143, 144, 145 for regions a' and a–e, or their bus bars 41–45, are provided on the substrate chip 1 as well. These terminals are contacted in a known manner with very thin bonding wires or the like. In one mode of operation of a converter of the invention, the terminal 142 of the bus bar 42 or of region b, b' is the input E1 for the one transmission function or for the one input signal I. Correspondingly, the terminal of the bus bar 43 or of region c, c' is the terminal E2 of the other transmission function or of the second input signal II. As already mentioned above, the regions a, a', d and e, or in other words the bus bars 41, 41', 44 and 45, are always allied to a common identical potential, preferably ground. If the filter is acted upon by the input signal E1, then the other input E2 must be connected to the potential of the regions a, a', d and e. Conversely if the input E2 is acted upon by the (other) input signal, then the input E1 should be connected to the potential of these further four regions. This kind of switch function, preferably embodied electronically, should additionally be provided in the invention as an external means of operating the dual filter.

One example of a further mode of operation of the converter is to apply the first input signal I, for the one transmission function, to the interconnected regions c, c' and a', and to connect the interconnected regions a, b, b', d and e to the same potential, such as ground. For the second transmission function of the filter, the second input signal II is applied to the regions b, b' and a, and the regions a', c, c ', d and e are applied to the same potential, such as ground. In this mode of operation as well, the overlaps of the region d and those of the region e with the respectively adjacent region are involved definitively for one and the other of the respective transmission functions of the dual-function converter of the invention.

In these two examples, with asymmetrical operation of the filter, the terminals of the input signal (I and II) and "same potential" can also be transposed.

The filter according to the invention can also be operated symmetrically; that is, one pole of the respective input signal is connected as indicated above, while the other pole is applied to the "same potential" terminal.

The invention thus leads to a single-track in-line filter and is preferably suitable as an advantageous substitute for two channel filters in the known versions (FIG. 2).

The dual-function converter according to the invention is described above as an input converter for a filter with surface acoustic wave technology. Depending on which input signal is supplied to the converter at its inputs E1 and E2, the converter of the invention generates the same acoustic wave, in the substrate, that is converted in the output converter into the respective same electrical output signal. The inputs E1 and E2 are the various combinations, as described above, of the connections to the various regions a–e.

The converter according to the invention can also be used to generate a respectively same electrical (output) signal; in that case, the converter of the invention, then operative as an output converter, is supplied in chronological alternation with two different acoustic waves. One example of this is a filter in accordance with FIG. 1, in which the converter 4 is then supplied with a certain predetermined electrical signal as an input signal, and this converter generates an acoustic wave in the substrate 1, and two different electrical signals, which are then output signals, are generated in the converter 2 that is then an output converter. These two different signals can be turn be picked up at the converter 2; specifically, the one signal can be picked up if one connection combination is present, while the other signal can be picked up if the other connection combination is present, or in other words as indicated for these connection combinations in the modes of operation described above.

In the sense of the invention, the term "surface acoustic waves" is understood to mean not only the acoustic waves of the Raleigh wave and Bleustein-Gulyaiv waves, but also surface skimming bulk waves (SSB acoustic waves), leaky surface waves, low waves, and similar waves.

I claim:

1. A surface acoustic wave filter for two input signals each corresponding to a different standard, comprising:
   a single-track filter, including:
      a piezoelectric substrate carrying a dual-function input converter receiving the two input signals and generating a respective output signal from each of the two input signals;
      said dual-function input converter comprising an interdigital structure disposed on said substrate, said interdigital structure defining first and second parts having transducer fingers defining regional interdigital overlaps among one another;
      said first part having two first regions, each one of said two first regions having transducer fingers comprising interdigital overlaps between said two first regions;
      said second part comprised of said two first regions and a further region with transducer fingers disposed between said two first regions, said two first regions and said further region disposed laterally adjacent to each other; and
      at least one additional region including transducer fingers disposed laterally adjacent a respective one of said two first regions and having interdigital finger overlaps with said transducer fingers of said respective first region.

2. The surface wave filter according to claim 1, including two further converter prong regions inserted respectively between two of said first regions, and two additional converter prong regions each positioned laterally adjacent to a respective one of said first regions.

3. The surface acoustic wave filter according to claim 1, wherein the two input signals are television input signals and said surface wave converter is a television channel signal converter for the two input signals.

4. An interdigital converter for a surface acoustic wave filter, comprising:

a single-track filter, including:
   a plurality of electrode fingers defining electrode finger regions, including first and second electrode finger regions defining a non-overlap region and an overlap region;
   a third electrode finger region disposed in said non-overlap region between said first and second electrode finger regions, said third electrode finger region overlapping said first and second electrode finger regions, respectively;
   a fourth electrode finger region overlapping one of said first and second electrode finger regions at a location lateral to said overlap region of said first and second electrode finger regions;
   and a first terminal for setting a first filter function by commonly connecting said second, third and fourth electrode finger regions to a first potential, and a second terminal for setting a second filter function by commonly connecting said first, third and fourth electrode finger regions to a second potential.

5. The interdigital converter according to claim 4, wherein:

said third electrode finger region has a first portion and a second portion, said second portion being disposed in front of said overlap region relative to a propagation direction of a surface acoustic wave and said second portion being disposed behind said overlap region relative to the propagation direction of the surface acoustic wave, and said fourth electrode finger region having a first part and a second part, said first part overlapping said first electrode finger region and said second part overlapping said second electrode finger region at a location opposite from said overlap region of said first and second electrode finger regions.

* * * * *